(12) United States Patent
Schmalz et al.

(10) Patent No.: US 9,171,411 B2
(45) Date of Patent: Oct. 27, 2015

(54) COMPENSATION OF DISTURBANCES UPON MAGNETIC MEASUREMENTS ON VALUE DOCUMENTS

(71) Applicant: GIESECKE & DEVRIENT GMBH, München (DE)

(72) Inventors: Steffen Schmalz, München (DE); Lothar Schütt, Dachau (DE); Jürgen Schützmann, Pfaffenhofen (DE)

(73) Assignee: GIESECKE & DEVRIENT GMBH, Munich (DE)

( * ) Notice: Subject to any disclaimer, the term of this patent is extended or adjusted under 35 U.S.C. 154(b) by 168 days.

(21) Appl. No.: 13/721,235

(22) Filed: Dec. 20, 2012

(65) Prior Publication Data

US 2013/0161391 A1 Jun. 27, 2013

(30) Foreign Application Priority Data

Dec. 21, 2011 (DE) .......................... 10 2011 121 876

(51) Int. Cl.
*G06K 7/08* (2006.01)
*G07D 7/04* (2006.01)
(Continued)

(52) U.S. Cl.
CPC .............. *G07D 7/04* (2013.01); *G01R 33/0029* (2013.01); *G06K 7/087* (2013.01)

(58) Field of Classification Search
CPC ........... G07D 7/04; G07D 7/004; G06K 7/08; G06K 7/083; G06K 7/084; G06K 7/087; G06K 7/082; G01N 27/9086; G01R 33/0017; G01R 33/0023; G01R 33/0029; G01R 33/0035; G01R 33/0094; G01R 33/02; G01R 33/022

USPC .................. 235/449, 450, 379; 324/202, 260; 194/210; 382/137, 139; 705/35, 39, 45
See application file for complete search history.

(56) References Cited

U.S. PATENT DOCUMENTS 4,864,238 A 9/1989 Seitz
4,967,156 A 10/1990 Seitz
(Continued)

FOREIGN PATENT DOCUMENTS

DE 3738455 A1 6/1988
DE 10 2007 061 826 A1 6/2009
(Continued)

OTHER PUBLICATIONS

English equivalent translation of WO 2014005714 A1 (Jan. 9, 2014).*
(Continued)

*Primary Examiner* — Michael G Lee
*Assistant Examiner* — Suezu Ellis
(74) *Attorney, Agent, or Firm* — Workman Nydegger

(57) ABSTRACT

A method for the compensation of disturbances upon magnetic measurements on value documents, in which a sensor having several measuring tracks for generating measurement signals is employed, in which for each value document a specified number of data records is generated, the value document not being captured by at least one of the measuring tracks during the measurement, wherein from the measurement signal of the at least one measuring track there is ascertained a value for the quantity of a disturbance present in the region of the sensor during the measurement on the value document, and a compensation of the deviations of the measurement signals of the measuring tracks capturing the value document, which deviations are caused by the disturbance present during the measurement, is carried out by means of said ascertained value for the quantity of the disturbance.

20 Claims, 2 Drawing Sheets

(51) Int. Cl.
*G01R 33/02* (2006.01)
*G01R 33/00* (2006.01)

(56) References Cited

U.S. PATENT DOCUMENTS

| | | | |
|---|---|---|---|
| 5,014,006 A | 5/1991 | Seitz | |
| 5,959,279 A * | 9/1999 | Komatsu | 235/449 |
| 6,182,896 B1 * | 2/2001 | Momose | 235/449 |
| 7,516,893 B2 * | 4/2009 | Buttifant et al. | 235/449 |
| 7,735,721 B1 * | 6/2010 | Ma et al. | 235/379 |
| 7,748,625 B2 * | 7/2010 | Kinoshita | 235/449 |
| 8,695,397 B2 * | 4/2014 | Sacquard et al. | 73/1.79 |
| 9,000,759 B2 * | 4/2015 | Ross | G01R 33/04 |
| | | | 324/228 |
| 2011/0174051 A1 | 7/2011 | Sacquard et al. | |
| 2015/0160326 A1 * | 6/2015 | Schutzmann | G07D 7/04 |
| | | | 324/202 |

FOREIGN PATENT DOCUMENTS

| | | |
|---|---|---|
| DE | 10 2008 048 043 A1 | 3/2010 |
| DE | 10 2009 050 618 A1 | 4/2011 |
| EP | 0883092 A2 | 12/1998 |
| WO | WO2014005414 A1 * | 1/2014 |

OTHER PUBLICATIONS

Search Report in German Patent Application 10 2011 121 876.2, Aug. 2, 2012 (2 pages).

* cited by examiner

COMPENSATION OF DISTURBANCES UPON MAGNETIC MEASUREMENTS ON VALUE DOCUMENTS

BACKGROUND OF THE INVENTION

A. Field of the Invention

The present invention relates to a method for the compensation of disturbances upon magnetic measurements on value documents.

B. Related Art

The check of value documents is of great importance, since the value documents are divided, on the basis of the check, for example into value documents which are authentic, forged, or suspicious. Upon the check of the value documents, also the type of value document is ascertained, thus for example in the case of a bank note its currency and denomination. Usually, by means of sensors there are performed magnetic measurements on the value documents, for the purpose of which the value documents to be checked are transported past the sensors and the measurement signals of the sensors for checking the value documents evaluated. Besides bank notes, further value documents such as checks, tickets, coupons, etc. can be checked in the same way.

The value documents have security elements, such as e.g. security strips, security threads, or prints, which contain magnetic or magnetizable materials. For the magnetic coding of a security element, also a certain characteristic sequence of magnetic and non-magnetic regions can be used, the arrangement of which represents a characteristic and machine-checkable coding of the value document, which are ascertained, as described above, by means of sensors, in order to check in this way the magnetic coding.

It has turned out, however, that the check of the magnetic properties of the magnetic materials of the security elements make high demands on the employed sensors, since only small amounts of the magnetic or magnetizable materials are employed, which is why the magnetic fields emanating from the security elements are low upon the check. The measurement and check of the magnetic properties of the security elements by means of the employed sensors is therefore particularly susceptible to disturbances, e.g. electromagnetic disturbances, as they occur for example in the environment of electrical machines

SUMMARY OF THE DISCLOSURE

It is therefore the object of the present invention to state a method for the compensation of disturbances upon magnetic measurements on value documents, which allows an improved check of security elements having magnetic or magnetizable materials.

The invention starts out from a method for the compensation of disturbances upon magnetic measurements on value documents, in which a sensor having several measuring tracks for generating measurement signals is employed, in which for each value document a specified number of data records is generated, the value document not being captured by at least one of the measuring tracks during the measurement, wherein from the measurement signal of the at least one measuring track there is ascertained a value for the quantity of a disturbance present in the region of the sensor during the measurement on the value document, and a compensation of the deviations of the measurement signals of the measuring tracks capturing the value document, which deviations are caused by the disturbance present during the measurement, is carried out by means of said ascertained value for the quantity of the present disturbance.

The invention has thus in particular the advantage that measurements with sensors for magnetic properties can be carried out on value documents in a secure and correct manner even when there occur strong disturbances during the measurement, for example electromagnetic disturbances in the environment of electrical machines and electrical lines carrying heavy current.

In a development according to the invention it is provided that there is ascertained additionally at least one value for the quantity of the disturbances within a value document for a region where no magnetic or magnetizable materials are present by means of at least one of the measuring tracks capturing the value document.

The development has the advantage that by the determination of the disturbances present on further measuring tracks of the sensor, altogether a more accurate and thus further improved compensation of the occurring disturbances is made possible.

DESCRIPTION OF THE DRAWINGS

Further advantages of the present invention appear from the dependent claims as well as the following description of embodiments with reference to Figures.

There are shown.

DETAILED DESCRIPTION

Figure 1:
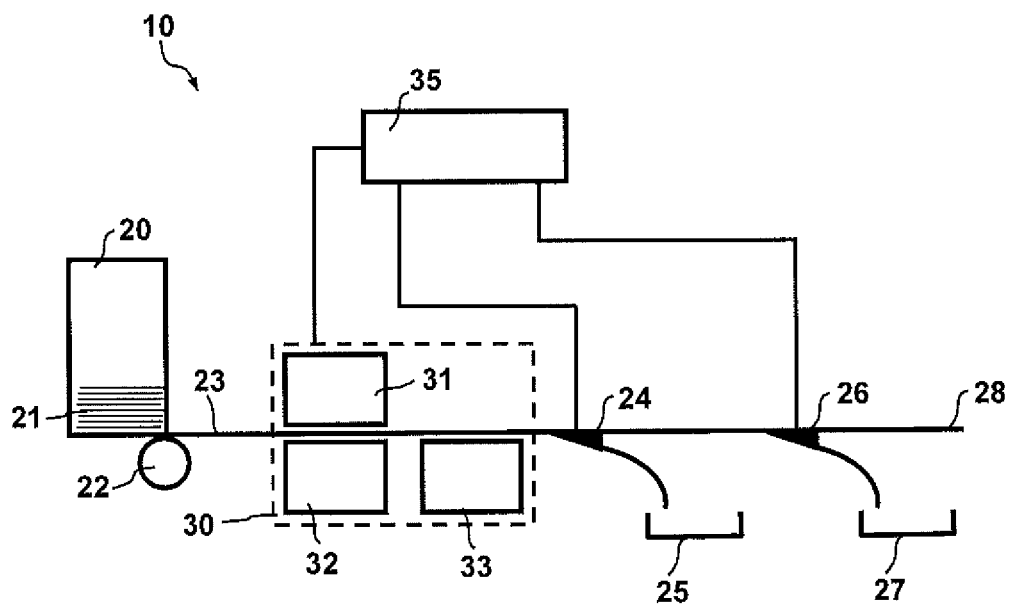
FIG. 1 a bank note processing machine for processing and checking value documents having magnetic security elements, FIG. 2 a sensor for measuring magnetic properties as well as magnetic properties of a value document measured by this sensor in a first measurement, FIG. 3 a power distribution, represented in frequency domain, of a measurement signal of the sensor of FIG. 2 for measuring magnetic properties, FIG. 4 the sensor of FIG. 2 for measuring magnetic properties as well as magnetic properties of a value document measured by this sensor in a second measurement, FIG. 5 a diagram of amplitudes of measurement signals of individual measuring tracks of the sensor of FIG. 4, and FIG. 6 the sensor of FIG. 2 for measuring magnetic properties as well as magnetic properties of a value document measured by this sensor.

FIG. 1 shows a bank note processing machine 10 for processing and checking value documents having magnetic security elements, which are hereinafter by way of example referred to as bank notes.

The bank note processing machine 10 has an input pocket 20 for inputting bank notes 21 to be processed, into which a singler 22 engages. The singler 22 grasps respectively one of the bank notes 21 to be processed and transfers the single bank note to a transport system 23, which transports the single bank note through a sensor arrangement 30.

In the sensor arrangement 30 sensors 31, 32, 33 are present, for example a first optical sensor 31, which captures light remitted by the bank note, a second optical sensor 32, which captures light transmitted by the bank note, and a third sensor 33 for measuring magnetic properties of the bank note. The sensors 31, 32, 33 perform measurements for checking the bank notes, upon which they capture properties of each single bank note and generate corresponding measurement signals. For this purpose, the sensors 31, 32, 33 capture the bank notes with a certain resolution, from which there results a image point size with which the bank notes are scanned and captured.

From the measurement signals of the sensors 31, 32, 33 for the captured image points of each of the bank notes, a control device 35 forms measurement data which represent every place on the surface of the respective bank note. Preferably, the respective bank notes are completely captured and corresponding measurement data for the complete bank note are generated.

From the measurement data the control device 35 derives properties which are relevant for checking the bank notes. These properties characterize the respective bank note and allow for example the check of its authenticity or the ascertainment of a certain currency and/or denomination. The respective properties can be derived for example from the measurement data of one or several of the sensors 31, 32, 33, for example from the measurement data of the magnetic properties of the sensors 33. In so doing, from the measurement data of the magnetic properties the presence and/or absence of magnetic or magnetizable materials at certain places of the respective bank note can be detected. In the control device 35 the measurement data are further processed and for this purpose compared e.g. with reference data stored in the control device 35, whereupon the control device 35 derives statements for example about the authenticity, currency, denomination, etc. of the respective bank note.

On the basis of the check of the respective bank note carried out by the control device 35, switches 24, 26 arranged in the transport system 23 are driven, e.g. in order to store bank notes of a certain denomination in an output pocket 25, whereas bank notes of other denominations can be stored in an output pocket 27. Via the transport system 23 the bank notes can be supplied to a further processing 28, e.g. storage in further output pockets or destruction by means of a (not shown) shredder.

As already mentioned, from the measurement signals of the sensors 31, 32, 33 or the measurement data there are derived properties, which make possible an evaluation of the bank notes by the control device 35. This is hereinafter explained more closely for the measurement signals of the sensor 33 for magnetic properties.

Figure 2:
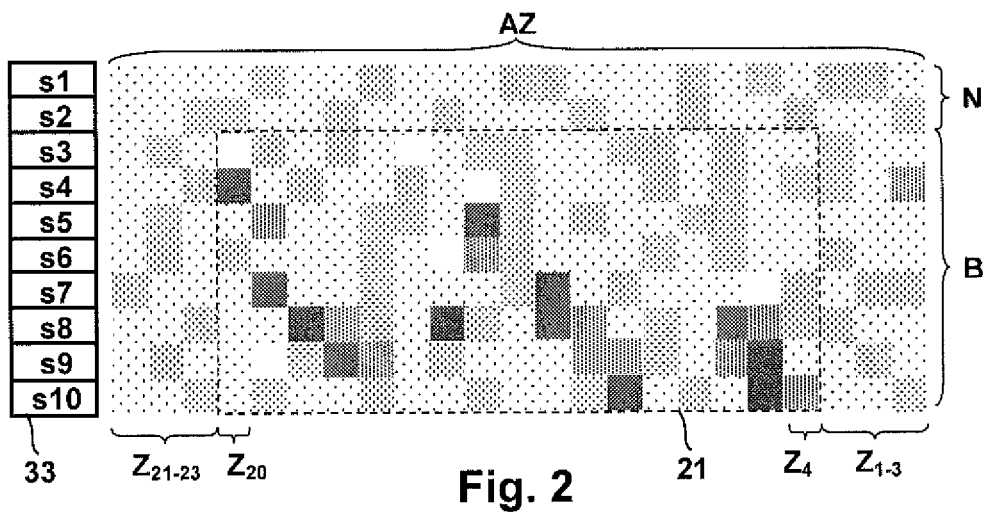

FIG. 2 shows the sensor 33 for measuring magnetic properties as well as magnetic properties of a value document 21, hereinafter referred to as bank note 21, measured by this sensor 33 in a first measurement.

In FIG. 2 there are represented measurement signals of the sensor 33 which has 10 measuring tracks s1 to s10. Measurement signals represented in a light tone are employed if no or only very little magnetic or magnetizable material is present upon the measurement. Measurement signals represented in a darker tone are employed if more magnetic or magnetizable material is present upon the measurement.

The represented measurement signals of the sensor 33 or of the measuring tracks s1 to s10 are generated, when the bank note 21 is transported in the plane of the representation of FIG. 2 from the left to the right over the sensor 33. During the transport of the bank note 21, the measurement signals of the sensor 33 are captured in regular intervals by the control device 35, thereby forming from the measurement signals of the measuring tracks s1 to s10 of the sensor 33 respectively a data record $Z_i$ having ten measurement signals for the measuring tracks s1 to s10. Altogether, for a bank note 21 there is generated a specified number AZ of such data records $Z_i$. The number AZ of data records $Z_i$ generated substantially results from the maximum length of the bank note to be processed and the desired spatial resolution of the measurement. In the represented example, 23 data records Z, are generated with i=1 to 23. The bank note 21 (indicated by dashed lines in FIG. 2) is captured in the represented example across its width B by the measuring tracks s3 to s10, their measurement signals being contained in the data records $Z_4$ to $Z_{20}$. The signals of the measuring tracks s1, s2 not covered by the bank note 21 deliver no measurement signals for the bank note 21, but rather measurement signals N for a bank note-free background in the region of the sensor 33. Respectively three data records before $Z_{1-3}$ and after $Z_{21-23}$ the bank note 21 are also bank note-free and also represent the background of the sensor 33. The data records before $Z_{1-3}$ and after $Z_{21-23}$ of the bank note 21 may arise through distances which are to be kept between bank notes to be processed.

Since the bank notes 21 have only small amounts of magnetic or magnetizable materials, disturbances, as they may occur in electrical machines, e.g. the employed bank note processing machine 10, in the form of electromagnetic disturbances, lead to considerable deviations of the measurement signals generated by the sensor 33 from the values actually to be expected.

In order to compensate the deviations occurring in the measurement signals, the disturbances occurring upon the measurement with sensor 33 are ascertained and taken into account by the control device 35 upon the formation of measurement data from the measurement signals of sensor 33. For this purpose, the measurement signals of at least one of the measuring tracks s1, s2 of sensor 33 are employed, which deliver no measurement signals for the bank note 21 but rather measurement signals for the bank note-free background of the sensor 33. These measurement signals of the background substantially represent the disturbances in the region of the sensor 33 present during the measurement. For compensating the disturbances, the measurement signals N or the measurement signals of one or more of the bank note-free measuring tracks s1, s2 are evaluated by the control device 35, in order to ascertain a value for the quantity of the present disturbances. Upon the generation of the measurement data for the bank note 21 from the measurement signals B of the sensor's measuring tracks s3 to s10 in the data records $Z_4$ to $Z_{20}$, the control device 35 employs the value for the quantity of the disturbances ascertained from the measurement signals of the measuring tracks s1, s2, in order to compensate the disturbances present in the region of the sensor 33.

For the described disturbance compensation it can be provided that the value for the present disturbances to be taken into account upon compensation is formed as an average value. For this purpose, the measurement signals of at least one of the bank note-free measuring tracks s1, s2, contained in the total number AZ of the data records $Z_i$, are employed. It can also be provided, however, that the ascertainment of the value for the present disturbances is effected for the measurement signals of each of the data records $Z_i$ or as an average value for respectively several of the data records $Z_i$.

Figure 3:
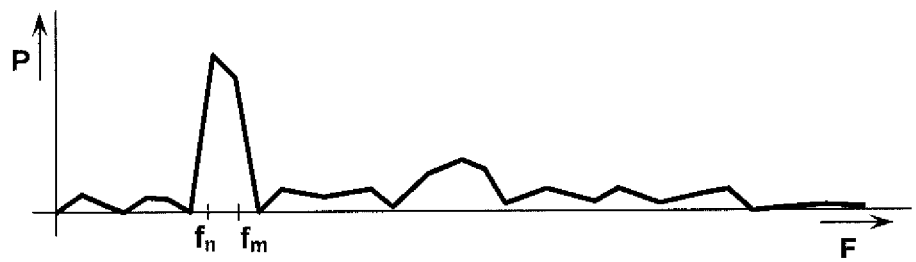

In FIG. 3 a power distribution of a measurement signal of the sensor 33 for measuring magnetic properties is represented in the frequency domain.

For this purpose, the measurement signal of one or both bank note-free measuring tracks s1, s2 is transformed into the frequency domain for example by means of a Fourier transform. In the frequency domain local maxima occurring in the power distribution are determined and associated frequencies $f_n$, $f_m$ ascertained. All of these frequencies $f_n$, $f_m$ may represent disturbing frequencies. It can also be provided, however, to take into account only that frequency as a disturbing frequency, which has the greatest power (absolute maximum), or those frequencies whose powers exceed a specified value. In electrical machines, as the employed bank note processing machine 10, the disturbing frequencies $f_n$, $f_m$ are often formed by the power-line frequency or by multiples of the power-line frequency. The signal component of the ascertained disturbing frequency $f_n$, $f_m$ is then, for the measurement data, removed from the measurement signals B of the measuring tracks s3 to s10 capturing the bank note 21. For this purpose, the measurement signals of the measuring tracks s3 to s10 are likewise transformed into the frequency domain, where the ascertained disturbing frequency or the ascertained disturbing frequencies $f_n$, $f_m$ is or are removed. After a subsequent back transformation into the time domain, measurement data for the measuring tracks s3 to s10 are present, which are compensated with respect to the disturbances present upon the measurement.

It is likewise possible, instead of completely removing the ascertained disturbing frequencies from the measurement signals for the measuring tracks s3 to s10, to reduce the power thereof in the frequency domain or to perform an averaging for the power of the respective disturbing frequency together with the power of neighboring frequencies of the respective disturbing frequency.

Figure 4:
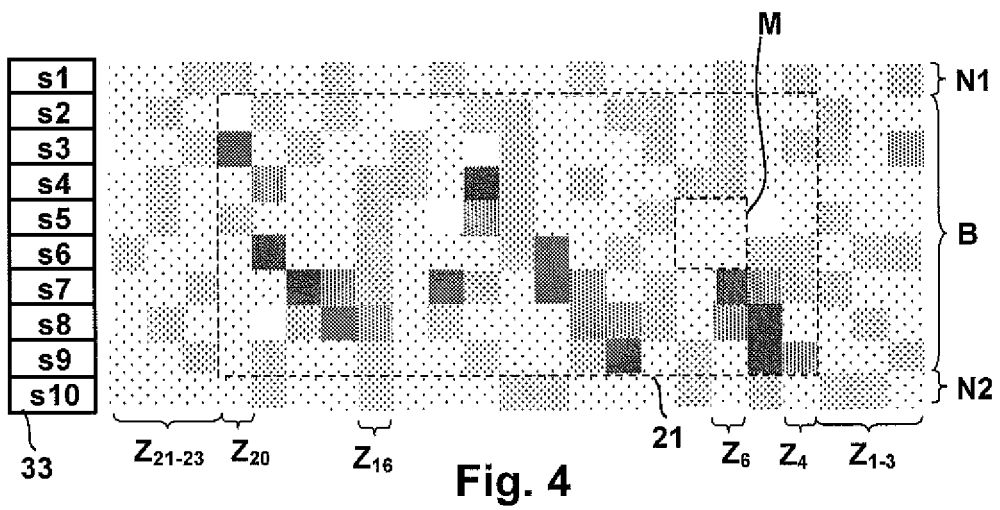

In FIG. 4 there is represented the sensor 33 of FIG. 2 for measuring magnetic properties as well as magnetic properties of the bank note 21 measured by this sensor 33 in a second measurement.

In FIG. 4 the bank note 21 is transported over the sensor 33 in such a way that the width B of the bank note 21 covers the measuring tracks s2 to s9. The measuring tracks s1, s10 are bank note-free, so that their measurement signals N1, N2 represent the bank note-free background in the region of the sensor 33.

Figure 5:
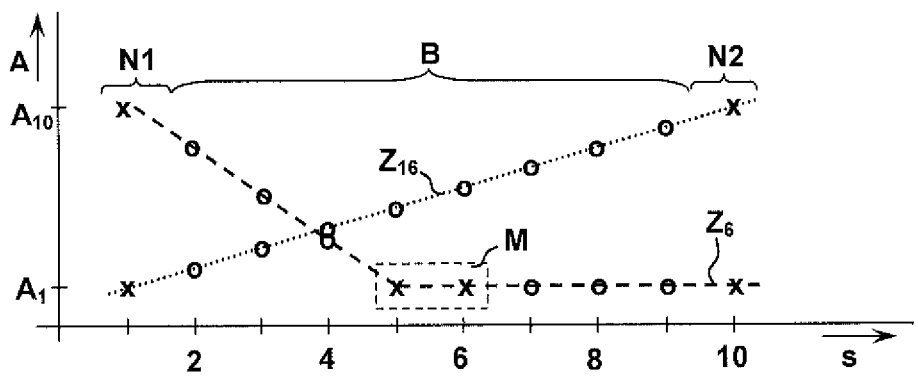

FIG. 5 shows a diagram of amplitudes of measurement signals of individual measuring tracks of the sensor 33 of FIG. 4.

The measurement signals for the measuring tracks s1 and s10 of the data record $Z_{16}$ are represented and marked with crosses x. Since these measurement signals represent the bank note-free background in the region of the sensor 33 and thus correspond substantially to the signal amplitude of the disturbances occurring in the region of the sensor 33, they can be employed for a compensation of the disturbances occurring in the region of the sensor 33. For this purpose, for the measuring tracks s2 to s9 lying between the measuring tracks s1 and s10 there is performed an interpolation, starting out from the measurement signals of the measuring tracks s1 and s10. For example, as represented in FIG. 5, a linear interpolation can be performed. Thereby resulting the amplitude values marked with circles o for the measuring tracks s2 to s9. For compensating the disturbances, the amplitude values for the disturbances ascertained in such a way by interpolation are taken into account upon generation of the measurement data by the control device 35, for example by subtraction of the interpolated amplitude values from the corresponding signal amplitudes of the measurement signals of the respective measuring tracks s2 to s9.

In the represented example, a linear interpolation was performed, a sigmoidal, polynomial or spline interpolation can be likewise performed.

Certain types of bank notes, e.g. a certain currency and denomination, can have one or several regions M within the bank note 21, in which no magnetic or magnetizable materials are present. If it is known which type of bank note is being processed, e.g. because only 10 Euro bank notes are being processed, or if the type of the bank note can be detected upon the processing, e.g. by an evaluation of the signals of the other sensors 31, 32 by the control device 35, additionally also measurement signals in the region of the bank note 21 can be employed, in order to ascertain further values for the quantity of the disturbances occurring in the region of the sensor. This is possible because at these places—as in the bank note-free sensor background of the measuring tracks—the measurement signal should be zero. Deviations from zero substantially represent disturbances present in the region of the sensor 33.

This is represented in FIG. 5 for example for the data record $Z_6$. Besides the measurement signals of the bank note-free measuring tracks s1 and s10, there can also be employed the measurement signals of the measuring tracks s5 and s6 in the region M lying within the bank note 21, because in case of the known bank note 21 to be checked it also known that in the region M of the bank note 21 no magnetic or magnetizable materials are present. Through the employment of the additional nodes of the measurement signals of the measuring tracks s5 and s6 in the region M, the interpolation for the measuring tracks s2 to s4 and s7 to s9 is improved, so that an improved compensation of the disturbances is made possible.

Values for the compensation of the disturbances present in the respective measuring tracks can be generated, as described above, for each of the data records $Z_i$. It is also possible, however, to generate corresponding values for the compensation of the present disturbances through averaging of the measurement signals of several data records $Z_i$ or through averaging of the measurement signals of the total number AZ of the data records $Z_i$.

Figure 6:
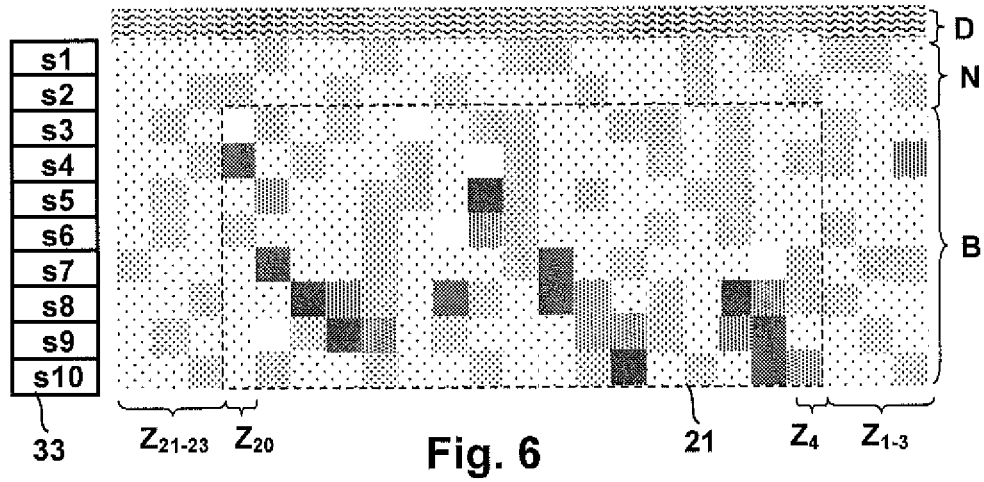

FIG. 6 shows the sensor 33 of FIG. 2 for measuring magnetic properties as well as the measured magnetic properties of the bank note 21.

The measurement signals N, B are expanded by additional data D. The additional data D here have a data structure which corresponds to the data structure of the measurement signals N, B. This makes possible, without great effort, to add additional information, about the measurement signals N, B and how these were achieved, to the measurement signals N, B, e.g. in order to be able to store or archive the measurement signals N, B. The additional data D allow a later detection and evaluation of the stored measurement signals N, B. The additional data D may contain for example specifications regarding the place and time of the generation of the measurement signals N, B or regarding the sensor type employed for generating the measurement signals N, B. For this purpose, the sensor can be marked for example by means of a serial number which is then added to the additional data D. Further specifications about the sensor may comprise information about the version of the hardware, about adjustment data, about adjustment time, etc. An elaborate archiving or administration of the measurement signals N, B is thus not necessary.

Instead of arranging the additional data D in line-shaped fashion, as represented, the additional data D can also be arranged in column-shaped fashion like an additional data record $Z_i$. Instead of writing the additional data D into additional lines or columns, also lines or columns of the measurement signals N, B can be employed, which contain no measurement signals of the bank note 21, thus the lines marked with N or the columns marked with $Z_{21-23}$ or $Z_{1-3}$. Likewise, the data D can also be written into other regions of the measurement signals not occupied or used, for example into the above-described regions M, which have no magnetic or magnetizable materials. If the data D are inserted in the regions M or in the lines of the measurement signals N, attention should be paid that a compensation of the disturbances is then no longer possible in the event that the additional data D completely replace the region M or the measurement signals N. In this case, it can also be provided, however, that already ascertained values for the quantity of the disturbances are also incorporated in the additional data D.

Besides the described employment of the additional data D for marking measurement signals of the magnetic sensor 33, corresponding additional data D can also be employed for marking the measurement signals of other sensors, e.g. the optical sensors 31, 32, to which they are added in the above-described way.

The invention was hitherto described with reference to a bank note processing machine, it is obvious, however, that the invention can be used wherever bank notes or other value documents are automatically judged with respect to their magnetic properties.

Departing from the description, it is also possible that there can be provided, instead of only one central control device 35, a control device in every sensor. Linking the data of the individual sensors is in this case performed in one of the control devices of the sensors or in a central control device.

In the above description there was described a sensor 33 with ten measuring tracks, it is obvious that other sensors can have more or less tracks. It must only be ensured that at least one of the measuring tracks is not covered by a bank note upon the measurements. The number of employed measuring tracks is dependent on the width of the bank notes to be examined as well as on the desired local resolution.

It is likewise obvious that the transport of the bank notes cannot only be effected, as described in the present example, parallel to the long edges of the bank notes. The bank notes can also be transported parallel to their short edges.

The above-described methods for the compensation of disturbances upon magnetic measurements on value documents can be used individually or in combined fashion, in order to improve the quality of the generated measurement data for value documents having magnetic or magnetizable materials.

The invention claimed is:

1. A method of determining an authenticity, currency, or denomination of a value document and moving the value document accordingly, the method comprising:
   moving a value document in a transport system past a magnetic sensor, the magnetic sensor having a plurality of measuring tracks for generating measurement signals, the measuring tracks being grouped into first and second sets, the second set having one or more of the measuring tracks and the first set having the remainder of the measuring tracks;
   generating a specified number of data records, by a control device, corresponding to the value document, each data record including:
      for each measuring track of the first set, a first measurement signal representing a property of the value document, measured by the corresponding measuring track, and
      for each measuring track of the second set, a second measurement signal representing a property not of the value document, measured by the corresponding measuring track;
   determining from the second measurement signals, by the control device, a value of a quantity of a disturbance present at the sensor during the measurement of the value document;
   determining deviations of the first measurement signals, by the control device, the deviations being caused by the disturbance present during the measurement of the value document, the deviations being dependent on the determined value of the quantity of the disturbance;
   deriving magnetic properties of the value document, by the control device, by applying a compensation of the deviations to the first measurement signals to take into account the determined amount of disturbance;
   determining, by the control device, one of an authenticity, a currency, or a denomination of the value document based on the derived magnetic properties of the value document; and
   moving the value document in the transport system, under control of the control device, to an output pocket or a shredder, based on the determined authenticity, currency, or denomination of the value document.

2. The method according to claim 1, wherein the value of the quantity of the disturbance is determined for each data record.

3. The method according to claim 1, wherein the value of the quantity of the disturbance is determined so as to take into account several of the data records or the specified number of data.

4. The method according to claim 1, wherein
   determining from the second measurement signals the value of the quantity of the disturbance present at the sensor comprises transforming at least one of the second measurement signals into a frequency domain and determining at least one frequency at which the at least one transformed second measurement signal has local maxima; and
   determining deviations of the first measurement signals comprises:
      transforming the first measurement signals into the frequency domain;
      adjusting a signal component of each of the first measurement signals in the frequency domain based on the first measurement signals in the frequency domain; and
      transforming the adjusted first measurement signals back into a time domain for further processing.

5. The method according to claim 4, wherein adjusting the signal component of each of the first measurement signals in the frequency domain comprises:
   removing the signal component of each of the first measurement signals at the ascertained at least one frequency, or
   reducing signal values of each of the first measurement signals at the ascertained at least one frequency, or
   averaging signal values of each of the first measurement signals at the ascertained at least one frequency together with signal values of neighboring frequencies.

6. The method according to claim 1, wherein the measuring tracks of the magnetic sensor are arranged in a linear array such that first and second measuring tracks of the second set are respectively positioned at both ends of the linear array and the measuring tracks of the first set are positioned between the first and second measuring tracks, so that as the value document moves past the magnetic sensor, the first and second measuring tracks obtain the second measurement signals, on opposite sides of the value document, that represent the magnetic property not of the value document, and
   wherein determining from the second measurement signals the value of the quantity of the disturbance present at the sensor comprises:
      determining values of the quantity of the for each of the first and second measuring tracks; and
      deriving values for the quantity of the disturbance for each of the measuring tracks of the first set by interpolation between the values of the quantity of the disturbances of the first and second measuring tracks.

7. The method according to claim 6, wherein the interpolation is a linear, sigmoidal, polynomial or spline interpolation.

8. The method according to claim 1, further comprising determining from one or more of the first measurement signals a second value of a quantity of disturbance present at the sensor, the one or more first measurement signals corresponding to each of one or more measuring tracks of the first set correspond to a particular region of the value document devoid of magnetic or magnetizable materials.

9. The method according to claim 1, wherein each data record includes additional data characterizing the first and second measurement signals of the corresponding data record.

10. The method according to claim 9, wherein the additional data have a data structure similar to that of the first and second measurement signals.

11. The method according to claim 9, wherein the additional data comprise specifications about the magnetic sensor as well as a time of generation of the first and second measurement signals.

12. A method of determining an authenticity, currency, or denomination of a value document and moving the value document accordingly, the method comprising:
- moving a value document in a transport system past a magnetic sensor, the magnetic sensor having a plurality of measuring tracks grouped into first and second sets, the first set having a plurality of the measuring tracks and the second set having one or more of the measuring tracks;
- magnetically measuring properties of the value document and generating corresponding first measurement signals, by each measuring track of the first set as the value document passes the magnetic sensor;
- magnetically measuring properties not of the value document and generating corresponding second measurement signals, by each measuring track of the second set as the value document passes the magnetic sensor;
- determining, from the second measurement signals, by a control device, an amount of disturbance present at the magnetic sensor during measurement of the value document; and
- deriving magnetic properties of the value document, by the control device, by compensating the first measurement signals to take into account the determined amount of disturbance;
- determining, by the control device, one of an authenticity, a currency, or a denomination of the value document based on the derived magnetic properties of the value document; and
- moving the value document in the transport system, under control of the control device, to an output pocket or a shredder, based on the determined authenticity, currency, or denomination of the value document.

13. The method according to claim 12, wherein the measuring steps are performed in a periodic manner as the value document passes the magnetic scanner.

14. The method according to claim 13, wherein a data record is generated for each period through the measuring steps, each data record being populated with the first and second measurement signals corresponding to the period.

15. The method according to claim 12, wherein compensating the first measurement signals to take into account the amount of disturbance comprises:
- determining deviations of the second measurement signals caused by disturbance, the deviations being dependent on the determined amount of disturbance;
- determining a compensation of the deviations; and
- applying the compensation to the first measurement signals.

16. The method according to claim 12, wherein
determining the amount of disturbance present at the magnetic sensor comprises:
- transforming the second measurement signals into a frequency domain; and
- determining at least one frequency at which the transformed second measurement signals have local maxima; and deriving magnetic properties of the value document comprises:
- transforming the first measurement signals into the frequency domain;
- adjusting a signal component of each of the transformed first measurement signals at the determined at least one frequency; and
- transforming the adjusted first measurement signals back into a time domain.

17. The method according to claim 12, wherein moving the value document to the output pocket or shredder comprises positioning the value document in one of a plurality of output pockets.

18. A system for determining an authenticity, currency, or denomination of a value document and transporting the value document accordingly, the system comprising:
- a magnetic sensor comprising a plurality of measuring tracks grouped into first and second sets, the first set having a plurality of the measuring tracks and the second set having one or more of the measuring tracks;
- an output device, the output device being an output pocket or a shredder;
- a transport system configured to:
  - transport a value document past the magnetic sensor such that as the value document passes the magnetic sensor, each of the measuring tracks of the first set magnetically measures properties of the value document and generates corresponding first measurement signals, and each of the measuring tracks of the second set magnetically measures properties not of the value document and generates corresponding second measurement signals; and
  - selectively transport the value document to the output device; and
- a control device that obtains the first and second measurement signals corresponding to the value document and based thereon:
  - determines, from the second measurement signals, an amount of disturbance present at the magnetic sensor during measurement of the value document;
  - derives magnetic properties of the value document by compensating the first measurement signals to take into account the determined amount of disturbance;
  - determines one of an authenticity, a currency, or a denomination of the value document based on the derived magnetic properties of the value document; and
  - causes the transport system to transport the value document to the output device based on the determined authenticity, currency, or denomination of the value document.

19. The system according to claim 18, further comprising a plurality of output pockets, the output device being one of the plurality of output pockets.

20. The system according to claim 18, wherein the magnetic sensors are positioned in a linear array, the magnetic sensors of the second set being positioned at an end of the linear array or at both ends of the linear array.

* * * * *